United States Patent
Fang et al.

(10) Patent No.: US 10,177,040 B2
(45) Date of Patent: Jan. 8, 2019

(54) MANUFACTURING OF FET DEVICES HAVING LIGHTLY DOPED DRAIN AND SOURCE REGIONS

(71) Applicant: Cypress Semiconductor Corporation, San Jose, CA (US)

(72) Inventors: Shenqing Fang, Sunnyvale, CA (US); Unsoon Kim, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/487,141

(22) Filed: Apr. 13, 2017

(65) Prior Publication Data
US 2017/0221768 A1  Aug. 3, 2017

Related U.S. Application Data

(62) Division of application No. 13/756,134, filed on Jan. 31, 2013, now abandoned.

(51) Int. Cl.
  *H01L 21/8238* (2006.01)
  *H01L 27/092* (2006.01)
  (Continued)

(52) U.S. Cl.
  CPC ........... *H01L 21/823814* (2013.01); *H01L 21/823828* (2013.01); *H01L 27/092* (2013.01);
  (Continued)

(58) Field of Classification Search
  None
  See application file for complete search history.

(56) References Cited

U.S. PATENT DOCUMENTS

| 5,023,190 A | 6/1991 | Lee et al. |
| 5,824,584 A | 10/1998 | Chen et al. |

(Continued)

FOREIGN PATENT DOCUMENTS

| JP | S61225859 A | 10/1986 |
| JP | 05055484 | 3/1993 |

(Continued)

OTHER PUBLICATIONS

International Search Report for International Application No. PCT/US2014/013853 dated May 29, 2014; 2 pages.

(Continued)

*Primary Examiner* — Daniel Whalen

(57) ABSTRACT

Embodiments described herein generally relate to methods of manufacturing n-type lightly doped drains and p-type lightly doped drains. In one method, photoresist mask is used to etch a transistor, and the mask is left in place (i.e., reused) to protect other devices and poly while a high energy implantation is performed in alignment with the photoresist mask, such that the implantation is adjacent to the etched transistor. One example of a high energy implantation is forming lightly doped source and drain regions. This technique of reusing a photoresist mask can be employed for creating lightly doped source and drain regions of one conductivity followed by using the technique a second time to create lightly doped source and drain regions of the complementary conductivity type. This may prevent use of at least one hard mask during manufacturing.

18 Claims, 14 Drawing Sheets

(51) Int. Cl.
*H01L 29/40* (2006.01)
*H01L 29/66* (2006.01)
*H01L 27/11568* (2017.01)
*H01L 27/11573* (2017.01)

(52) U.S. Cl.
CPC ...... *H01L 27/11568* (2013.01); *H01L 29/401* (2013.01); *H01L 29/6659* (2013.01); *H01L 27/11573* (2013.01)

(56) References Cited

U.S. PATENT DOCUMENTS

| | | | |
|---|---|---|---|
| 5,969,383 | A | 10/1999 | Chang et al. |
| 6,103,559 | A | 8/2000 | Gardner et al. |
| 6,165,827 | A | 12/2000 | Ahmad et al. |
| 6,972,997 | B2 | 12/2005 | Ishimaru et al. |
| 7,057,230 | B2 | 6/2006 | Tanaka et al. |
| 7,115,943 | B2 | 10/2006 | Mine et al. |
| 7,371,631 | B2 | 5/2008 | Sakai et al. |
| 7,414,283 | B2 | 8/2008 | Tanaka et al. |
| 7,504,689 | B2 | 3/2009 | Hisamoto et al. |
| 7,557,005 | B2 | 7/2009 | Ishii et al. |
| 7,663,176 | B2 | 2/2010 | Sakai et al. |
| 7,667,259 | B2 | 2/2010 | Yasui et al. |
| 7,700,992 | B2 | 4/2010 | Tanaka et al. |
| 7,723,779 | B2 | 5/2010 | Hisamoto et al. |
| 7,863,135 | B2 | 1/2011 | Sakai et al. |
| 7,863,670 | B2 | 1/2011 | Ishii et al. |
| 8,017,986 | B2 | 9/2011 | Tanaka et al. |
| 8,125,012 | B2 | 2/2012 | Mine et al. |
| 2002/0022354 | A1 | 2/2002 | Furukawa et al. |
| 2003/0199133 | A1 | 10/2003 | Rodder et al. |
| 2004/0203207 | A1 | 10/2004 | Watanabe et al. |
| 2007/0187797 | A1 | 8/2007 | Kato et al. |
| 2009/0280613 | A1 | 11/2009 | Onoda et al. |
| 2010/0144108 | A1* | 6/2010 | Sakai ............ H01L 21/823842 438/258 |
| 2010/0173458 | A1 | 7/2010 | You et al. |
| 2010/0308420 | A1 | 12/2010 | Usujima et al. |
| 2011/0211396 | A1 | 9/2011 | Takeuchi |
| 2012/0164803 | A1 | 6/2012 | Chen et al. |
| 2014/0167140 | A1* | 6/2014 | Fang ............... H01L 29/42344 257/326 |

FOREIGN PATENT DOCUMENTS

| | | | |
|---|---|---|---|
| JP | 2011049282 | A | 3/2011 |
| JP | 2011103401 | A | 5/2011 |
| JP | 6276668 | B2 | 2/2018 |
| KR | 1020100012643 | A | 2/2010 |

OTHER PUBLICATIONS

Ito, F. et al., "A Novel MNOS Technology Using Gate Hole Injection in Erase Operation for Embedded Nonvolatile Memory Applications," 80-81, Symposium on VLSI Technology, Digest of Technical Papers, Renesas Technology Corporation, 2004.

Matsubara, K. et al., "Highly Reliable 10ns MONOS Flash," elmicro.com/files/renesas/monos_flash_ewc_2008_for_proceedings.pdf, Renesas Technology Europe GmbH, 2008.

Tanaka, T., et al., Hitachi, "A 512kB MONOS type Flash Memory Module Embedded in a Micro Controller," 211-212, Symposium on VLSI Circuits, Digest of Technical Papers, Semiconductor & Integrated Circuits, Hitachi, Ltd., 2003.

Tsuji, Y. et al., "New Degradation Mode of Program Disturb Immunity of Sub-90nm Node Split-Gate SONOS Memory," 699-700, Reliability Physics Symposium, IEEE International, IRPS, Device Platforms Research Labratories, NEC Corporation, 2008.

USPTO Advisory Action for U.S. Appl. No. 13/756,134 dated Jan. 13, 2015; 2 pages.

USPTO Advisory Action for U.S. Appl. No. 13/756,134 dated Sep. 8, 2016; 3 pages.

USPTO Advisory Action for U.S. Appl. No. 13/756,134 dated Dec. 18, 2015; 3 pages.

USPTO Final Rejection for U.S. Appl. No. 13/756,134 dated Jan. 13, 2017; 11 pages.

USPTO Final Rejection for U.S. Appl. No. 13/756,134 dated Jul. 8, 2016; 12 pages.

USPTO Final Rejection for U.S. Appl. No. 13/756,134 dated Oct. 16, 2015; 13 pages.

USPTO Final Rejection for U.S. Appl. No. 13/756,134 dated Nov. 7, 2014; 11 pages.

USPTO Non-Final Rejection for U.S. Appl. No. 13/756,134 dated Feb. 12, 2015; 16 pages.

USPTO Non-Final Rejection for U.S. Appl. No. 13/756,134 dated Feb. 29, 2016; 10 pages.

USPTO Non-Final Rejection for U.S. Appl. No. 13/756,134 dated Jul. 1, 2014; 8 pages.

USPTO Non-Final Rejection for U.S. Appl. No. 13/756,134 dated Oct. 20, 2016; 12 pages.

USPTO Requirement for Restriction Election for U.S. Appl. No. 13/756,134 dated May 20, 2014; 5 pages.

Written Opinion of the International Searching Authority for International Application No. PCT/US2014/013853 dated May 29, 2014; 6 pages.

Yanagi, I., et al., "Quantum confinement effect of efficient hole injection in MONOS-type nonvolatile memory—the role of ultrathin i-Si/P+ poly-Si stacked gate structure fabricated by laser spike annealing," 146-147, Symposium on VSLI Technology, Digest of Technical Papers, Central Research Laboratory, Hitachi Ltd., 2007.

EPO Exam Report for Application No. 14746768.2 dated Jan. 16, 2018; 6 pages.

EPO Search Report for Application No. 14746768.2 dated Oct. 21, 2016; 10 pages.

JPO Office Action for Application No. 2015-556129 dated Jan. 5, 2018; 12 pages.

JPO Office Action for Application No. 2015-556129 dated Oct. 2, 2018; 7 pages.

\* cited by examiner

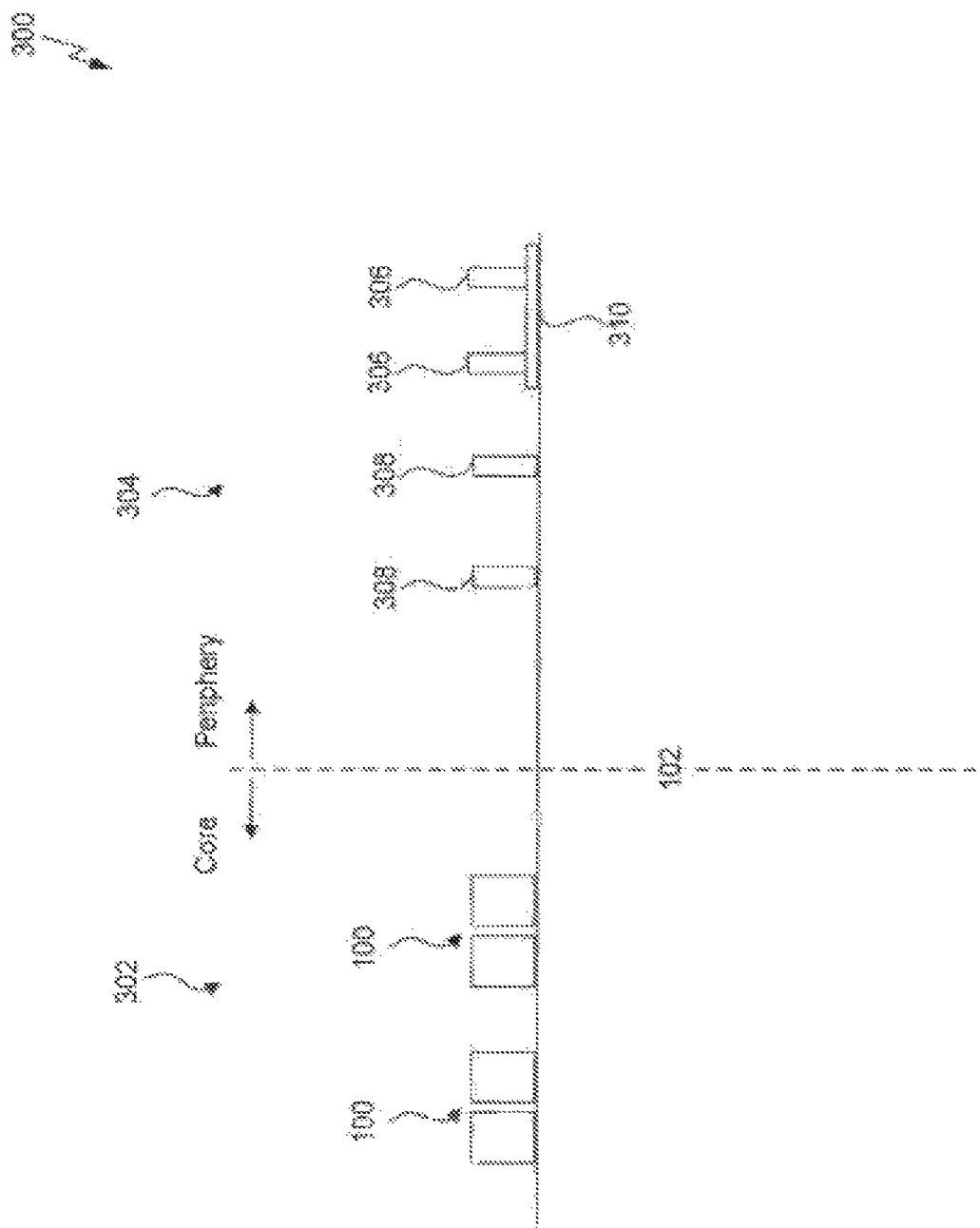

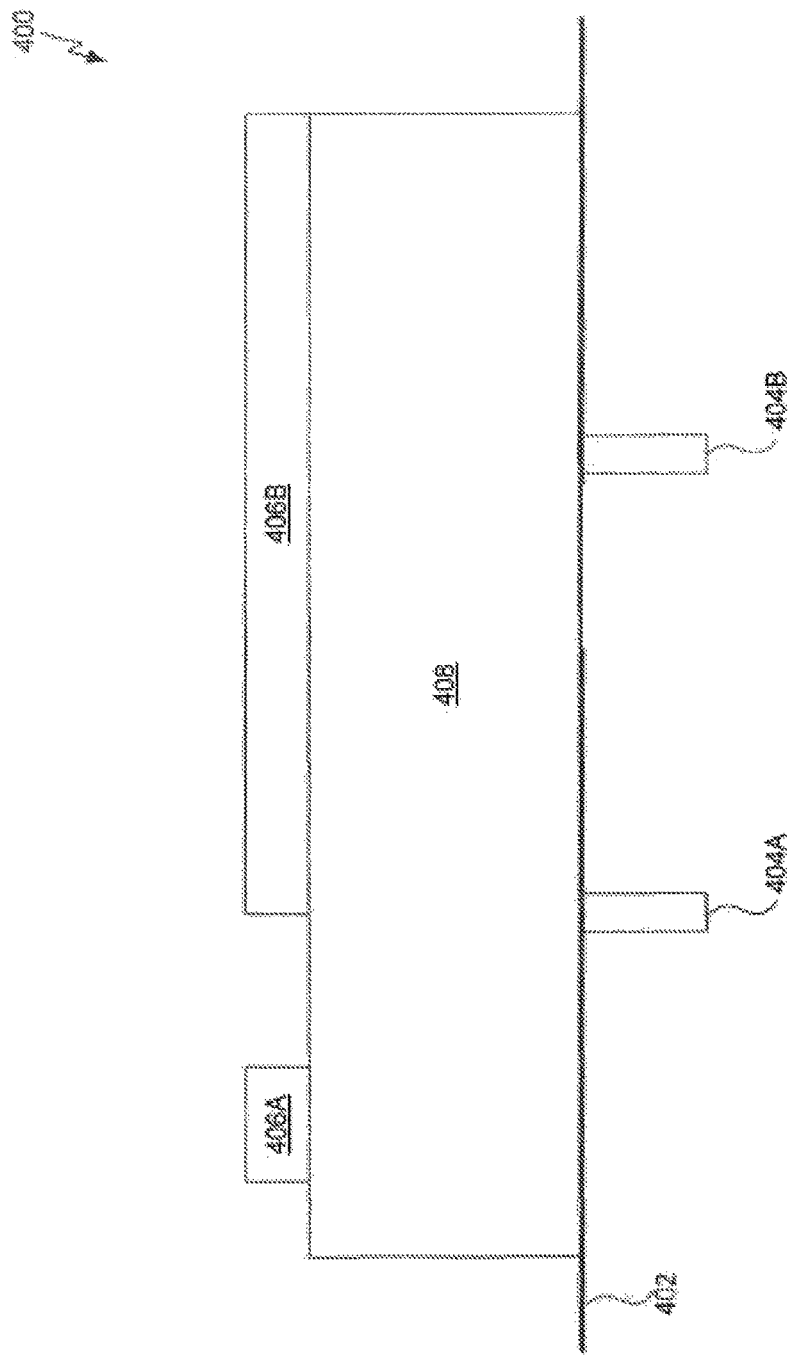

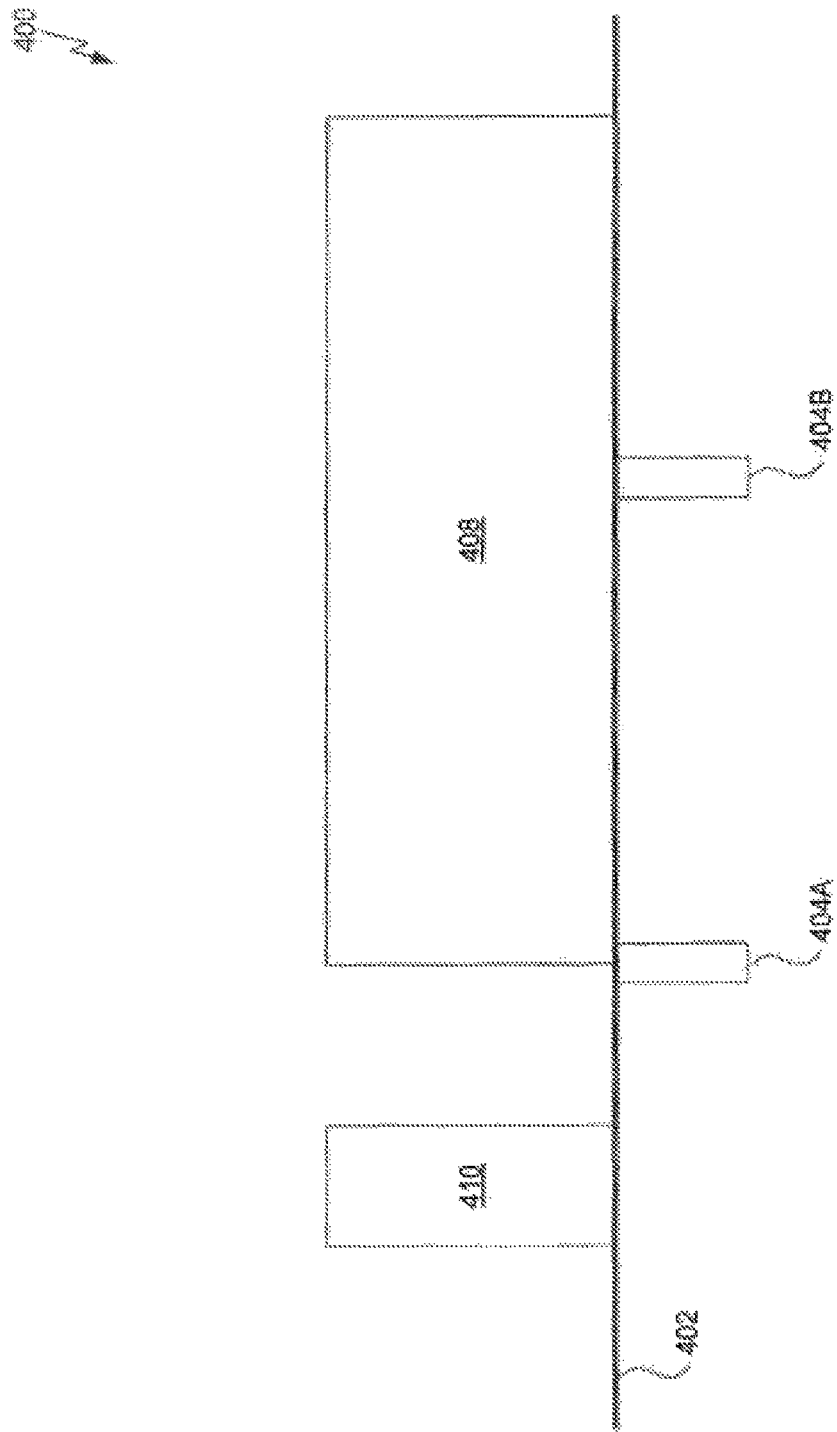

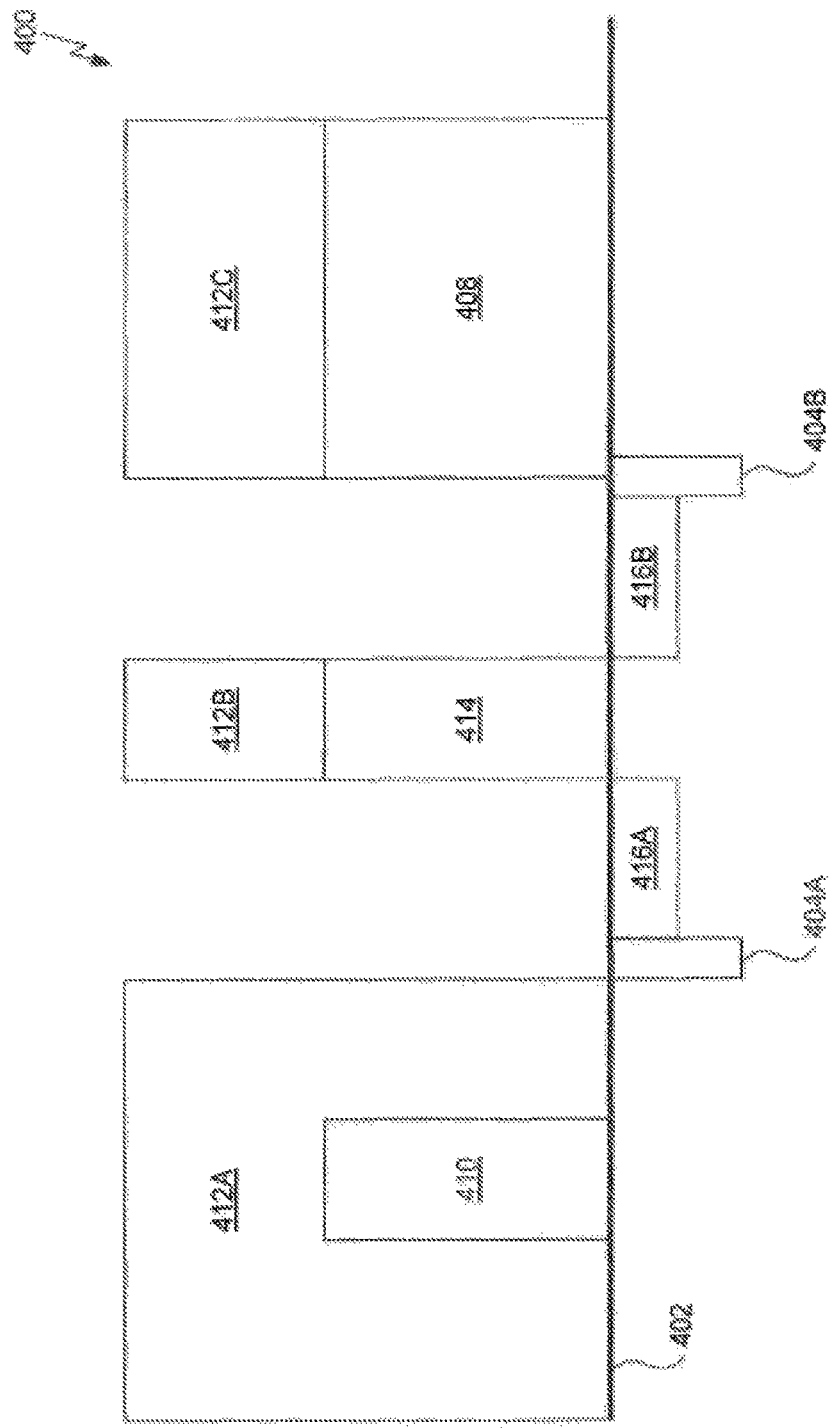

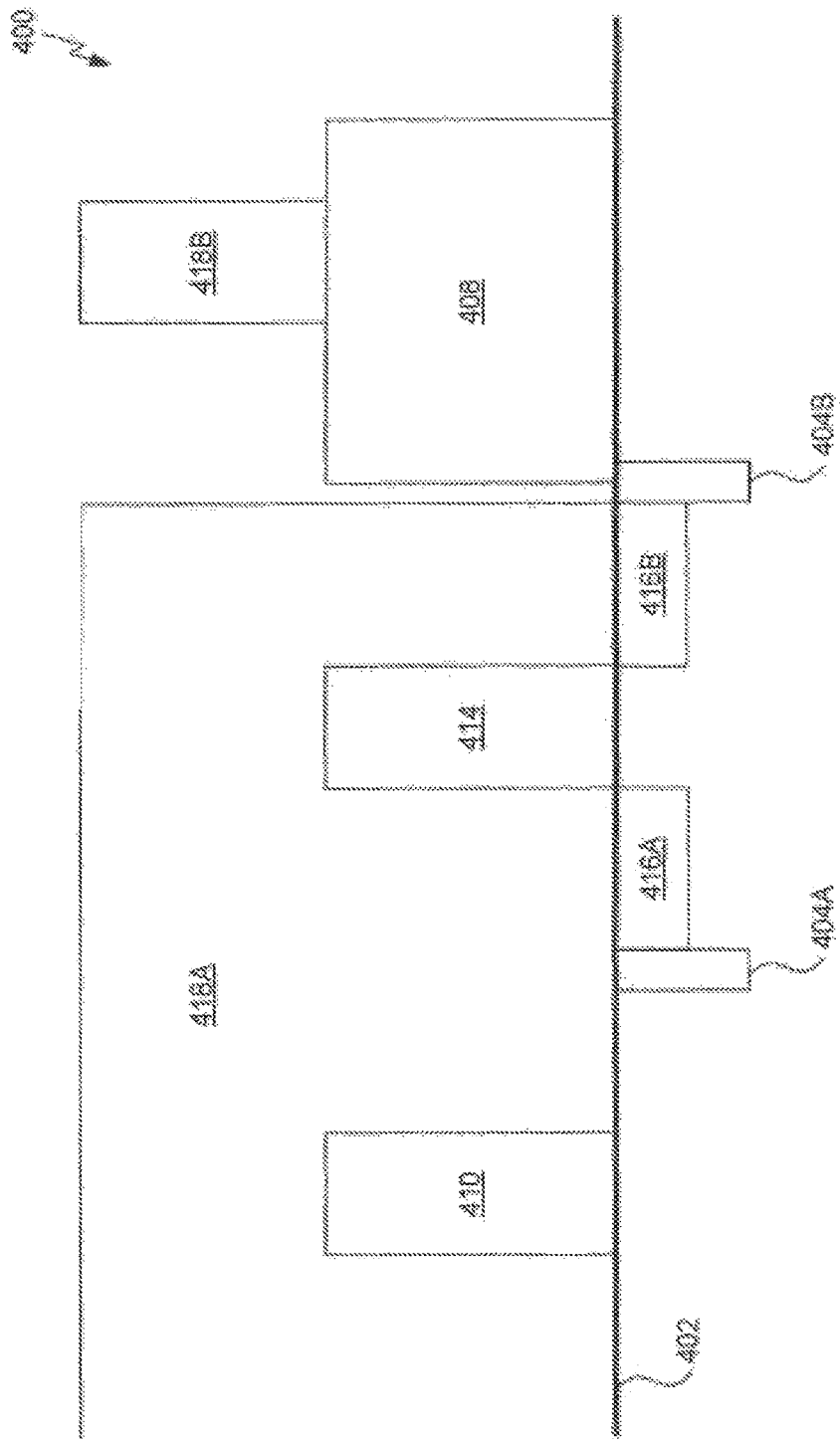

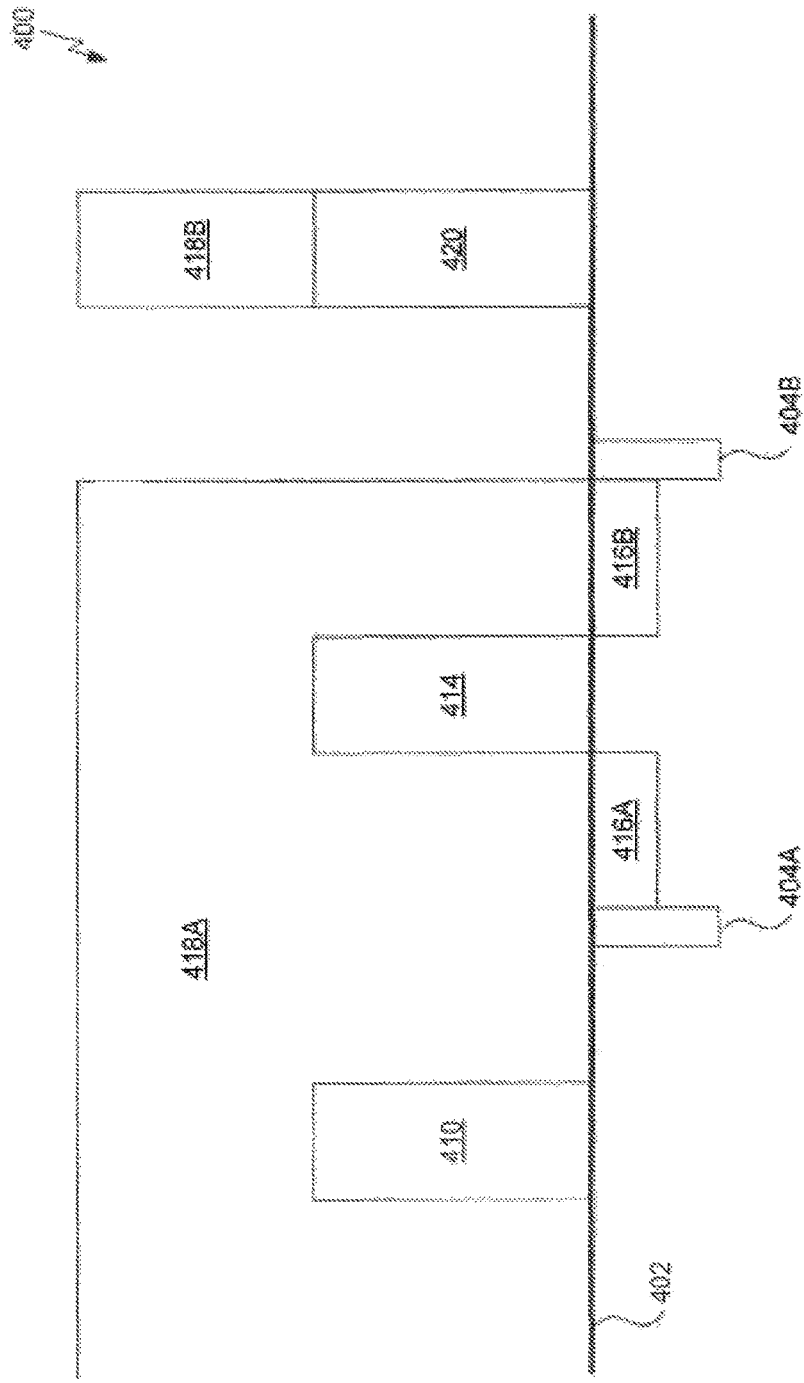

MANUFACTURING OF FET DEVICES HAVING LIGHTLY DOPED DRAIN AND SOURCE REGIONS

CROSS REFERENCE TO RELATED APPLICATIONS

This application is a divisional of U.S. patent application Ser. No. 13/756,134, filed Jan. 31, 2013, all of which is incorporated by reference herein in its entirety.

TECHNICAL FIELD

The embodiments described herein generally relate to the manufacturing of integrated circuits.

BACKGROUND

A non-volatile memory, such as Flash memory, retains stored data even if power to the memory is removed. A non-volatile memory cell stores data for example, by storing electrical charge in an electrically isolated floating gate or in a charge-trapping layer underlying a control gate of a field-effect transistor (FET). The stored electrical charge controls the threshold of the FET, thereby controlling the memory state of the cell.

It is common to monolithically incorporate multiple types of field-effect devices on the same substrate as memory cells. Those non-memory devices perform for example, decoding, charge-pumping, and other functions related to memory operations. The substrate may also include non-memory devices to provide functions that are not related to memory operations. Such non-memory devices incorporated on the same substrate as the memory cells may include transistors tailored for high-speed operations, while other transistors are tailored for handling high operating voltages. Integrating the processing of memory cells, such as a split-gate memory cell, with the processing of one or more types of non-memory transistors on the same substrate is challenging as each requires different fabrication parameters.

Additional types of integrated circuits, such as analog devices pose manufacturing challenges. Many analog devices, such as a low noise amplifier, have more stringent noise tolerances than FET devices used in digital logic. Mixed signal electronics, those with integrated digital and analog signals, can be found in music players, cameras and cellular telephones. As with the memory cells, these analog devices pose fabrication challenges due to the different lubrication parameters. Accordingly, there is a need for device and methods for integrating field effect transistors and other devices on the same substrate to facilitate improved cost, performance, reliability, or manufacturability.

BRIEF SUMMARY

It is desirable to obviate or mitigate at least one of the problems, whether identified herein or elsewhere, or to provide an alternative to existing apparatuses or methods. Embodiments described herein include methods, systems and devices for forming high voltage gates in a computer memory or other integrated circuitry.

In particular, a method is described wherein a photoresist mask is used to etch a transistor, and the mask is left in place (i.e., reused) to protect other devices and poly while a high energy implantation is performed in alignment with the photoresist mask, such that the implantation is adjacent to the etched transistor. One example of a high energy implantation is forming lightly doped source and drain regions. This technique of reusing a photoresist mask can be employed for creating lightly doped source and drain regions of one conductivity followed by using the technique a second time to create lightly doped source and drain regions of the complementary conductivity type. This may prevent use of at least one hard mask during manufacturing.

In an embodiment, a method of manufacturing a semiconductor device that includes a first substrate region and a second substrate region. A gate layer is disposed on the first and second substrate regions. A first gate is formed in the first substrate region from the gate layer. A second gate is formed in the second substrate region from the gate layer. First lightly doped source and drain regions are formed substantially adjacent to the second gate. A third gate is formed in the second substrate region from the gate layer. Second lightly doped source and drain regions are formed substantially adjacent to the third gate. In this method, the second lightly doped source and drain regions are of complementary conductivity type to the first lightly doped source and drain regions. Additionally, the third gate is formed after the first source and drain regions are formed.

In an embodiment, a semiconductor device includes a first substrate region and a second substrate region. There is a first gate in the first substrate region. There is a second gate in the second substrate region. There is a third gate in the second substrate region. There are first lightly doped source and drain regions substantially adjacent to the second gate. There are second lightly doped source and drain regions, substantially adjacent to the third gate. In the embodiment, the second lightly doped source and drain regions are of a complementary conductivity type to the first lightly doped source and drain regions. The second gate and the third gate are configured to withstand the same amount of voltage, which is more than the first gate is configured to withstand. Additionally, the first lightly doped drain region is older than (i.e., formed before) the third gate.

In an embodiment, a method of manufacturing a semiconductor device that includes a first substrate region and a second substrate region. A thin poly layer is disposed on the first and second substrate regions. A first gate is formed in the first substrate region from the thin poly layer. A first photoresist mask is disposed on the thin poly layer, across both the first substrate region and the second substrate region. A second gate is etched in the second substrate region through the first photoresist mask. A first high energy implant is performed through the first photoresist mask while the photoresist mask protects the poly in both the first and second substrate regions. The first photoresist mask is removed. A second photoresist mask is disposed on the thin poly layer, across both the first substrate region and the second substrate region. A third gate is etched in the second substrate region through the second photoresist mask. A second high energy implant is performed through the second photoresist mask while the photoresist mask protects the poly in both the first and second substrate regions. The second photoresist mask is removed. According to this method, lightly doped source and drain regions of complementary conductivity types can be formed without the need of a hard mask.

These and other advantages and features will become readily apparent in view of the following detailed description of embodiments of the invention. Note that the Summary and Abstract sections may set forth one or more, but not all exemplary embodiments of the present invention as contemplated by the inventor(s). It is to be appreciated that the Detailed Description section, and not the Summary and Abstract sections, is intended to be used to interpret the claims.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

FIG. 3 illustrates an example semiconductor device that includes both memory and peripheral circuitry embedded in the same substrate, according to an embodiment.

FIGS. 4A-4J illustrate a semiconductor device in various stages of manufacturing, according to an embodiment.

Figure 1:
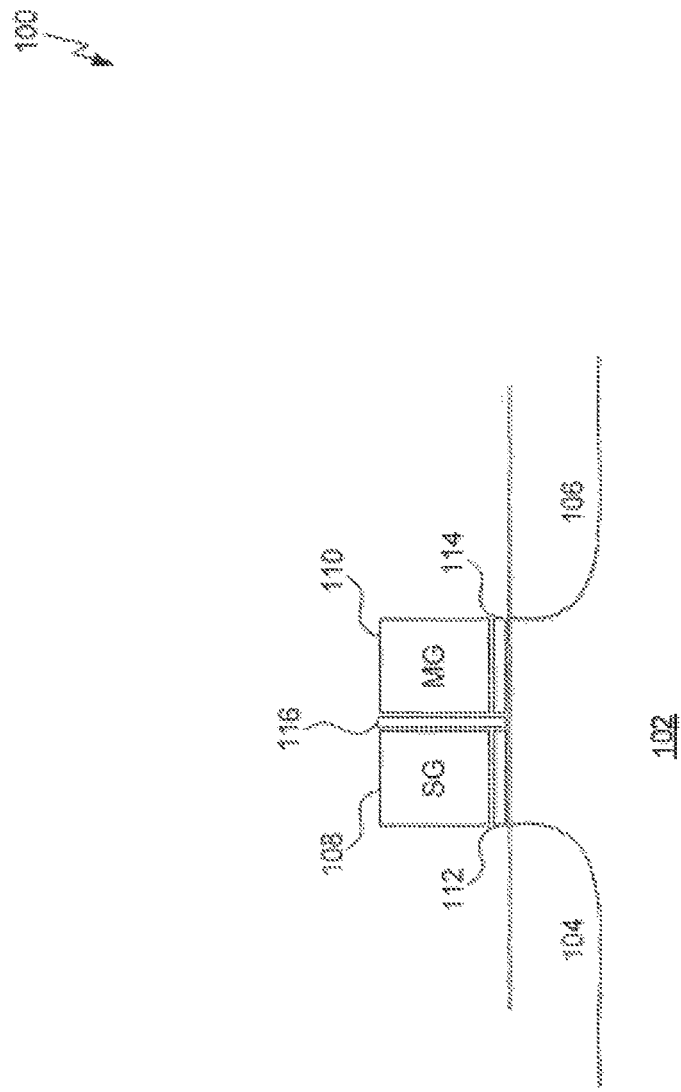
FIG. 1 illustrates an example of a split-gate non-volatile memory cell, according to an embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the Specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing the various embodiments in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete.

The above description, serves to distinguish the term "etching" from "removing." When etching a material, at least a portion of the material remains behind after the process is completed. However, "removing" is considered to be a broad term that may incorporate etching.

During the descriptions herein, various regions of the substrate upon which the field-effect devices are fabricated are mentioned. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

The terms "deposit" or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc.

The term "substrate" as used throughout the descriptions is most commonly thought to be silicon. However, the substrate may also be any of a wide array of semiconductor materials such as germanium, gallium arsenide, indium phosphide, etc. In other embodiments, the substrate mm be electrically non-conductive such as a glass or sapphire wafer.

The term "poly" as used throughout the descriptions is most commonly thought to be polycrystalline silicon. Poly comprises multiple small crystals as opposed to being a single monocrystal. Poly can be doped, or may have metal or a metal silicide deposited over it.

"Poly" in this application is used as one example of a gate conductor. Other conductors may be used to form the gates, for example metals, alloys other doped semiconductors or conducting materials as would become apparent to a person having ordinary skill in the art. The use of "poly" in the description of the embodiments is not to be limiting.

A non-volatile memory cell s programmed using, for example, hot carrier injection to place charge into a storage layer. High drain and gate voltages are used to facilitate the programming process, and the memory cell conducts relatively high current during programming, which can be undesirable in low voltage or low power applications.

A split-gate memory cell is a type of non-volatile memory cell, in which a select gate is placed adjacent a memory gate. During programming of a split-gate memory cell, the select gate is biased at a relatively low voltage, and only the memory gate is biased at the high voltage to provide the vertical electric field necessary for hot-carrier injection. Since acceleration of the carriers takes place in the channel region mostly under the select gate, the relatively low voltage on the select gate results in more efficient carrier acceleration in the horizontal direction compared to a conventional Flash memory cell. That makes hot-carrier injection more efficient with lower current and lower power consumption during programming operation. A split-gate memory cell may be programmed using techniques other than hot-carrier injection, and depending on the technique, any advantage over the conventional Flash memory cell during programming operation may vary.

Fast read time is another advantage of a split-gate memory cell. Because the select gate is in series with the memory gate, the erased state of the memory gate can be near or in depletion mode (i.e., threshold voltage, Vt, less than zero volt). Even when the erased memory gate is in such depletion mode, the select gate in the off state prevents the channel from conducting substantial current. With the threshold voltage of the erased stale near or below zero, the threshold voltage of the programmed state does not need to be very high while still providing a reasonable read margin between erased and programmed states. Accordingly, the voltages applied to both select gate and memory gate in read operation can be less than or equal to the supply voltage. Therefore, not having to pump the supply voltage to a higher level makes the read operation faster.

FIG. 1 illustrates an example of a split-gate non-volatile memory cell 100 according to an embodiment. Memory cell 100 is formed on a substrate 102, such as silicon. Substrate 102 is commonly p-type or a p-type well while a first doped source/drain region 104 and a second doped source/drain region 106 are n-type. However, it is also possible for substrate 102 to be n-type while regions 104 and 106 are p-type.

Memory cell 100 includes two gates, a select gate 108 and a memory gate 110. Each gate may be a doped poly layer formed by well known, for example, deposit and etch techniques to define the gate structure. Select gate 108 is disposed over a dielectric layer 112. Memory gate 110 is disposed over a charge trapping dielectric 114 having one or more dielectric layers. In one example, charge trapping dielectric 114 includes a silicon nitride layer sandwiched between two silicon dioxide layers to create a three-layer stack collectively and commonly referred to as "ONO". Other charge trapping dielectrics may include a silicon-rich nitride film, or any film that includes, but is not limited to, silicon, oxygen, and nitrogen in various stoichiometries. A vertical dielectric 116 is also disposed between select gate 108 and memory gate 110 for electrical isolation between the two gates. In some examples, vertical dielectric 116 and charge trapping dielectric 114 are the same dielectric, while other examples form one dielectric before the other (e.g., they cart have different dielectric properties.) As such, vertical dielectric 116 need not include the same film structure as charge trapping dielectric 114. After the gates have been defined, regions 104 and 106 are created by implanting dopants using, for example, an ion implantation technique. Regions 104 and 106 form the source or drain of the split-gate transistor depending on what potentials are applied to each. In split gate transistors, for convenience, region 104 is commonly referred to as the drain, while region 106 is commonly referred to as the source, independent of the relative biases, it is to be understood that this description is meant to provide a general overview of a common split-gate architecture and that, in actual practice, many more detailed steps and layers are provided to form the final memory cell 100.

An example write, read, and erase operation will now be described as it relates to memory cell 100. In order to write a bit in memory cell 100, a positive voltage on the order of 5 volts, for example, is applied to region 106 while region 104 and substrate 102 are grounded. A low positive voltage on the order of 1.5 volts, for example, is applied to select gate 108 while a higher positive voltage on the order of 8 volts, for example, is applied to memory gate 110. As electrons are accelerated within a channel region between the source and drain, some of them will acquire sufficient energy to be injected upwards and get trapped inside charge trapping dielectric 114. This is known as hot electron injection. In one example of charge trapping dielectric 114, the electrons are trapped within a nitride layer of charge trapping dielectric 114. This nitride layer is also commonly referred to as the charge trapping layer. The trapped charge within charge trapping dielectric 114 store the "high" bit within memory cell 100, even after the various supply voltages are removed.

In order to "erase" the stored charge within memory cell 100 and return the state of memory cell 100 to a "low" bit, a positive voltage on the order of 5 volts, for example, is applied to region 106 while region 104 is floated or at a certain bias, and select gate 108 and substrate 102 are typically grounded. A high negative voltage on the order of −8 volts, for example, is applied to memory gate 110. The bias conditions between memory gate 110 and region 106 generate holes through band-to-band tunneling. The generated holes are sufficiently energized by the strong electric field under memory gate 110 and are injected upwards into charge trapping dielectric 114. The injected holes effectively erase the memory cell 100 to the "low" bit state.

In order to "read" the stored hit of memory cell 100, a low voltage is applied to each of the select gate, memory gate, and region 104 in the range between zero and 3 volts, for example, while region 106 and substrate 102 are typically grounded. The low voltage applied to the memory gate is chosen so that it lies substantially equidistant between the threshold voltage necessary to turn on the transistor when storing a "high" bit and the threshold voltage necessary to turn on the transistor when storing a "low" bit in order to clearly distinguish between the two states. For example, if the application of the low voltage during the "read" operation caused substantial current to flow between regions 104 and 106, then the memory cell holds a "low" bit and if the application of the low voltage during the "read" operation does not cause substantial current to flow between regions 104 and 106, then the memory cell holds a "high" bit.

Figure 2:
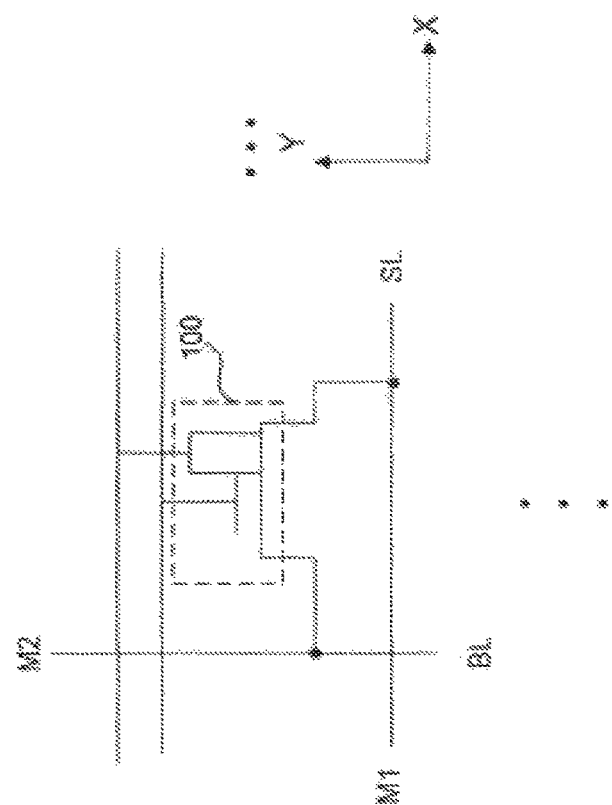
FIG. 2 illustrates an example circuit diagram of memory cell including connections to various metal layers in a semiconductor device, according to an embodiment.

FIG. 2 illustrates an example circuit diagram of memory cell 100 including connections to various metal layers in a semiconductor device. Only a single memory cell 100 is illustrated, however, as evidenced by the ellipses in both the X and Y direction, an array of memory cells may be connected by the various lines running in both the X and Y directions. In this way, one or more memory cells 100 may be selected for reading, writing, and erasing bits based on the bit line (BL) and source line (SL) used.

An example source line (SL) runs along the X direction and is formed in a first metal layer (M1). Source line (SL) may be used to make electrical connection with doped region 106 of each memory cell 100 along a row extending in the X direction.

An example bit line (BL) runs along the Y direction and is formed in a second metal layer (M2). Bit line (BL) may be used to make electrical connection with doped region 104 of each memory cell 100 along a column extending in the Y direction.

It is to be understood that the circuit connections shown in FIG. 2 are only exemplary and that the various connections could be made in different metal layers than those illustrated. Furthermore, although not depicted, memory cells 100 may be arrayed in the Z direction as well formed within multiple stacked layers.

FIG. 3 illustrates an example semiconductor device that includes both memory and peripheral circuitry in the same substrate. In this example, substrate 102 includes a core region 302 and a periphery region 304. Core region 302 includes a plurality of memory cells 100 that may operate similarly to those previously described. It should be understood that the cross-section of FIG. 3 is only exemplary, and that core region 302 and periphery region 304 may be located in any area of substrate 102 and may be made up of various different regions. Furthermore, core region 302 and periphery region 304 may exist in the same general area of substrate 102.

Periphery region 304 may include integrated circuit components such as resistors, capacitors, inductors, etc., as well as transistors. In the illustrated embodiment, periphery region 304 includes a plurality of high-voltage transistors 306 and low-voltage transistors 308. In one example, high-voltage transistors 306 exist in a separate region of substrate 102 than low-voltage transistors 308. High-voltage transistors 306 are capable of handling voltages up to 25 volts in magnitude, for example, while low-voltage transistors 308 operate at a faster speed, but cannot operate at the same high voltages as high-voltage transistors 306. In an embodiment, low voltage transistors 308 are designed to have a shorter gate length than high voltage transistors 306. High-voltage transistors 306 are commonly characterized as having a thicker gate dielectric 310 than the gate dielectric of low-voltage transistors 308.

With charge trapping memory, there is a desire to manufacture low voltage transistors 308 and memory cells 100 from a thin poly layer because the thin layer allows for improved performance. However, given that semiconductor device manufacturing generally occurs as a series of steps involving disposing layers, it would be impractical to manufacture the high voltage transistors 306 from a different layer of poly than the low voltage transistors 308, thus constraining the high voltage transistors 306 to have the same thickness as the low voltage transistors 308. Where thinness improves the performance of a low voltage transistor 308, thinness can leave transistors 306 and 308 susceptible to implant penetration. In particular, high voltage transistors 306 receive a high energy implant to form the lightly doped drains and source. High energy implants are often performed with more than 80,000 electron volts depending on implant species. A high-energy implant to form the lightly-doped drain in high voltage transistors 306 can penetrate the entire thickness of the thin poly and adversely affect the doping profile of the transistor channel region below the poly gate. A thin poly layer can be from 40 nanometers (nm) to 100 nm thick, and is preferably 80 nm thick. One approach to protecting the thin poly is described in co-pending application Ser. No. 13/715,739, entitled "High Voltage Gate Formation," which is herein incorporated by reference in its entirety.

The co-pending application's approach, however, uses a hard mask to protect against the high energy implantation. The co-pending application's approach also used three blanket resist processes to create the high voltage transistors 306 (i.e., the blanket resist to etch the low voltage transistor 308 would be a fourth blanket resist). There may be significant cost savings if a hard mask or one of the blanket resists could be avoided. One additional manufacturing advantage to not having a hard mask is that, as poly becomes thinner, the appropriate hard masks approach becomes more difficult to make compatible with an advanced logic process flow.

FIGS. 4A-4J collectively illustrate an example fabrication process for forming semiconductor device 400, according to an embodiment of the present invention. It should be understood that the various layers and structures are not necessarily drawn to scale, and that other processing steps may be performed between those steps illustrated and described herein, as would be understood by one skilled in the art given the present disclosure.

Prior to the step of FIG. 4A, many steps are required to create the structures on the substrate 402, such as disposing layers, masking, stripping, and the like, as would be apparent to a person having ordinary skill in the art.

FIG. 4A illustrates a substrate 402 comprising silicon, or the like, and shallow trench isolations 404 formed therein. A poly layer 408 is formed on the substrate 402. The poly layer 408 is an example of a gate layer. Two instances of a photoresist mask 406 are patterned on the poly layer 408. One way to form a photoresist is to spin on a blanket resist, use a photomask to expose certain sections of the blanket resist to ultra-violet light, and then apply a developer to the blanket resist.

In another embodiment, the gate layer can comprise a metal layer. In an embodiment employing a metal layer, a poly layer may be disposed before the metal layer is disposed. This poly layer may serve as a sacrificial gate to be replaced by a metal gate at a later step. One approach to creating a metal gate is described in co-pending application Ser. No. 11/735,241, entitled "Memory System with Poly Metal Gate," which is herein incorporated by reference in its entirety.

Figures 1, 4C:
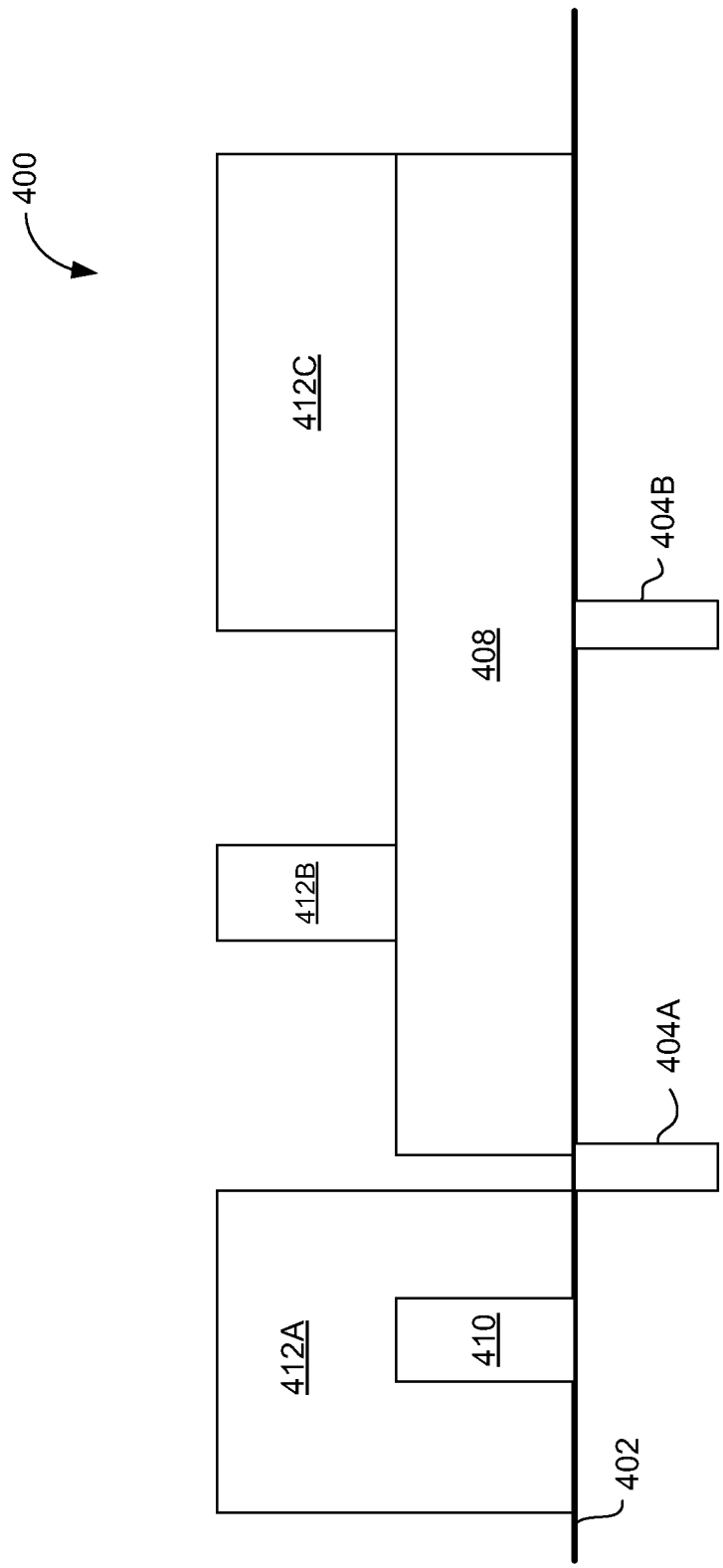
Figures 2, 4C:
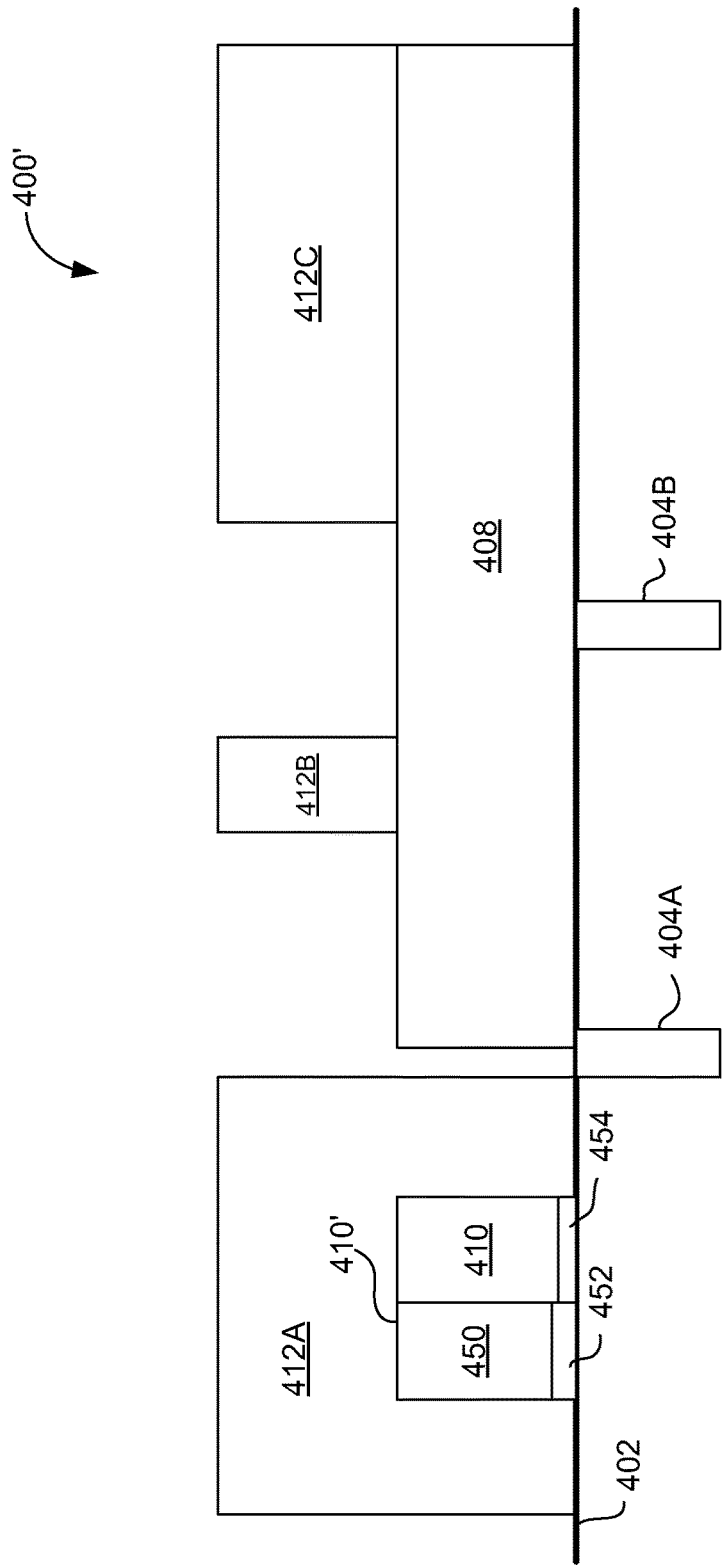

As illustrated by FIGS. 4B and 4C-1, etching, for example, is used to remove the portions of the poly layer 408 that are unprotected by the photoresist mask 406. The etching defines a section of poly that, with a source, a drain and wiring, can serve as a low voltage transistor 410. The photoresist 406 is then stripped.

In another embodiment, as best shown in FIG. 4C-2, the low voltage transistor 410 may instead serve as a memory cell 410'. To create a memory cell 410' instead of the low voltage transistor 410, it is preferred to dispose a dielectric 454 on the region of the substrate 402 before disposing the poly layer 408. If there were a dielectric 454 underneath the low voltage transistor 410, the low voltage transistor 410 could serve as a select gate 410, as best shown and described in FIG. 1 and its corresponding description. As described in co-pending application Ser. No. 13/715,739, a charge trapping layer 452, such as ONO, could be added followed by an additional layer of poly to form a memory gate 450 to complete the memory cell 410'. This approach is an example of forming the first substrate region as a memory substrate region.

In another embodiment, a memory cell 410' may be formed in the same region of the substrate 402 as the low voltage transistor 410, as described in co-pending application Ser. No. 13/715,739. This approach is an example of forming the first substrate region as a combination of memory and low voltage regions. Such a first substrate region can be larger than the one illustrated in FIG. 4B.

As illustrated by FIGS. 4C-1 and 4C-2, a second photoresist mask 412 is disposed. One way to apply the second photoresist mask 412 is a spin-coating.

Figure 4D:
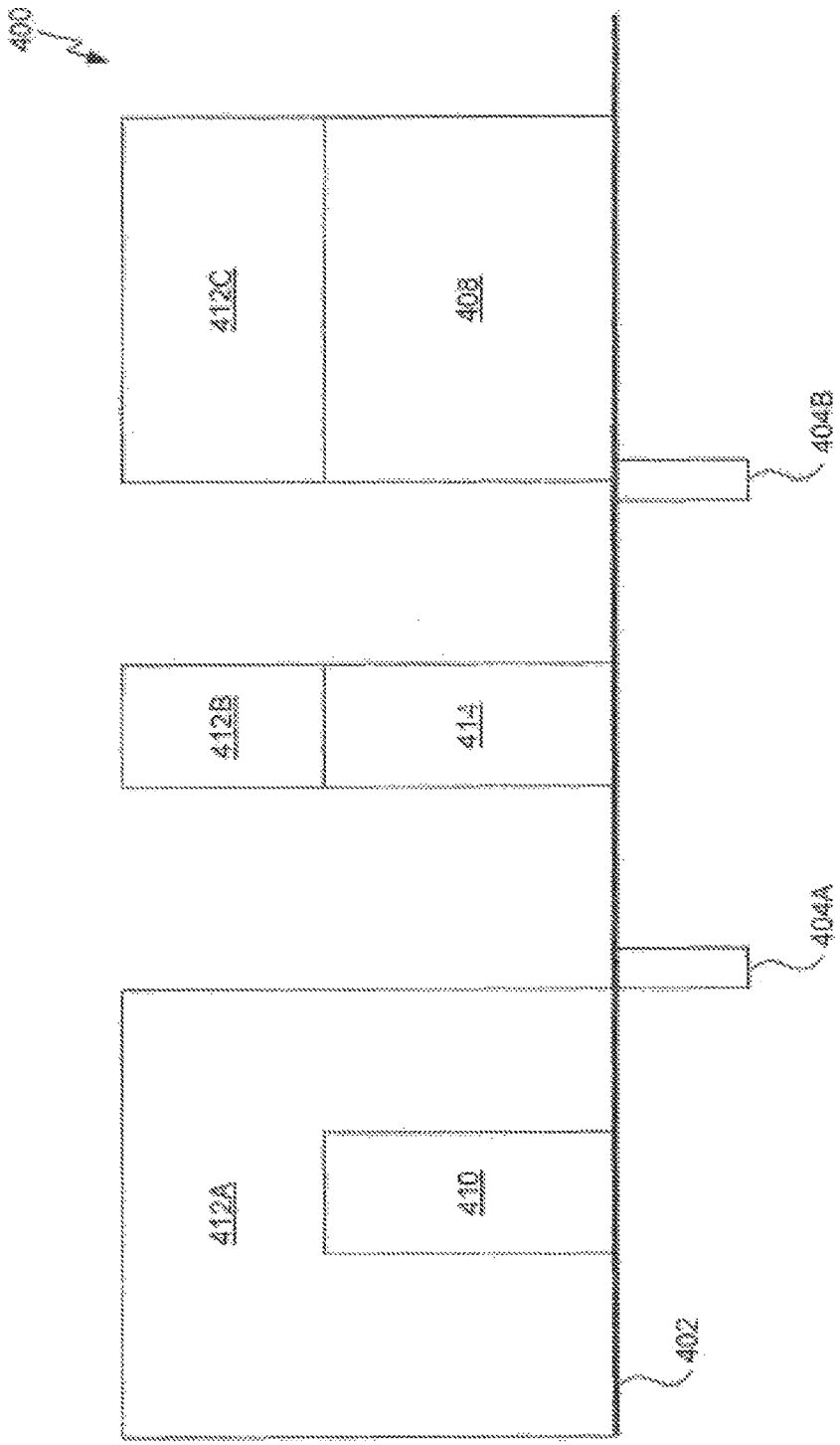

As illustrated by FIG. 4D, etching, for example, is used to remove the portions of the poly layer 408 that are unprotected by the photoresist mask 412. The etching defines a section of poly that, with a source, a drain and wiring, can serve as a high voltage transistor 414.

As illustrated by FIG. 4E, lightly doped source and drain regions 416 are implanted adjacent to the high voltage transistor 414. The lightly doped regions 416 are preferably formed from an edge of the high voltage transistor 414, or even from slightly underneath the high voltage transistor 414, and extend to the shallow trench isolation 404. The source and drain regions 416 may be a n-type lightly doped drain region (i.e., using an n conductivity type dopant) or a p-type lightly doped drain region i.e., using a p⁻ conductivity type dopant). A doped region's status as a source or drain is determined, in part, by electrical connections commonly formed later in the manufacturing process. Therefore, while this application distinguishes between source and drain regions, the two may be considered interchangeable.

Figure 4F:
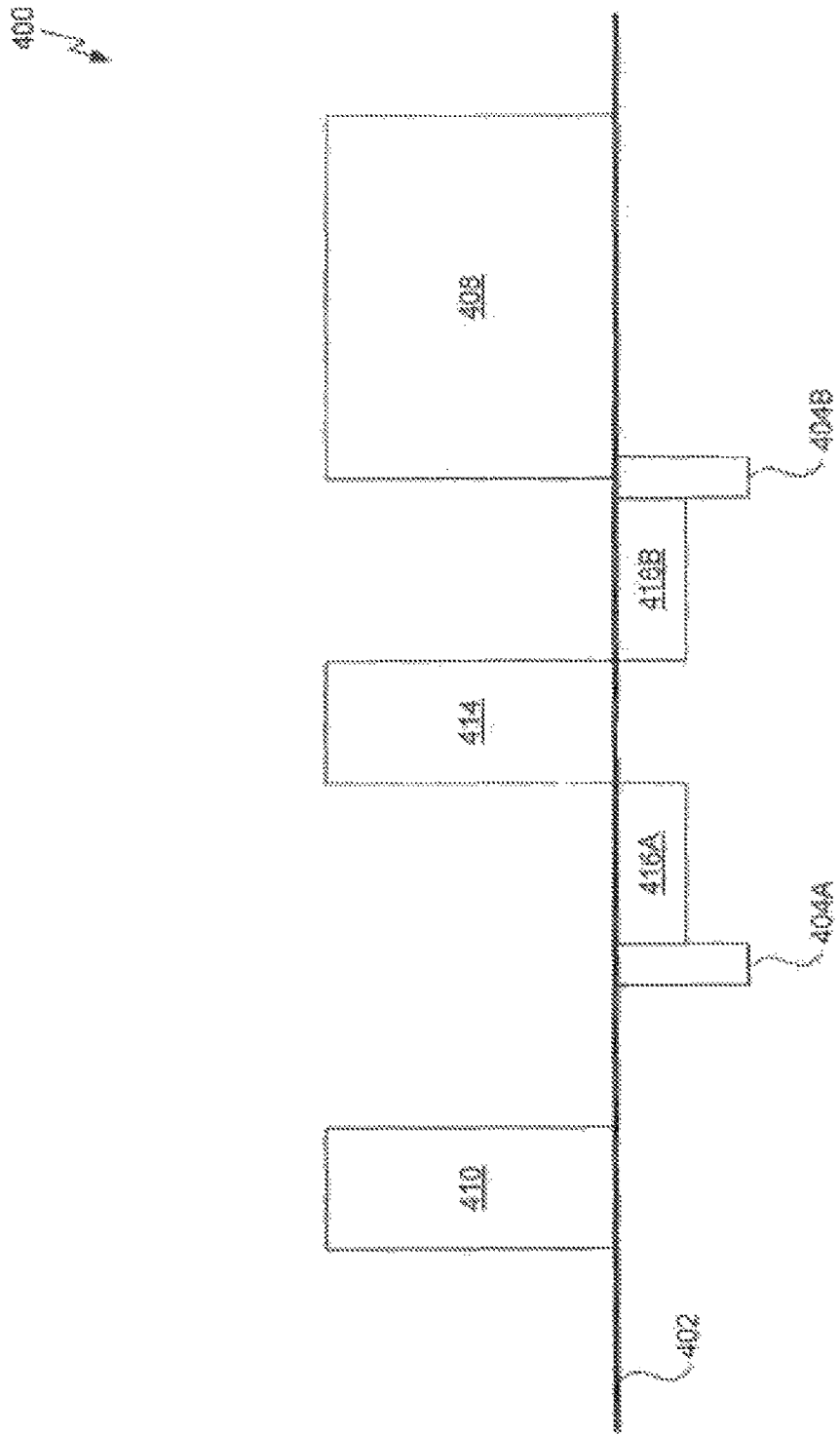

As illustrated by FIG. 4F, the photoresist mask 412 is stripped. One advantage of removing the photoresist mask 412 at this step is that the photoresist mask 412 can be reused both for the etching in FIG. 4D and again for implanting the lightly doped source and drain regions in FIG. 4E.

As illustrated by FIG. 4G, a third photoresist mask 418 is disposed.

As illustrated by FIG. 4H, etching, for example, is used to remove the portions of the poly layer 408 that are unprotected by the photoresist mask 418. The etching defines a section of poly that, with a source, a drain and wiring, can serve as a second high voltage transistor 420.

Figure 4I:
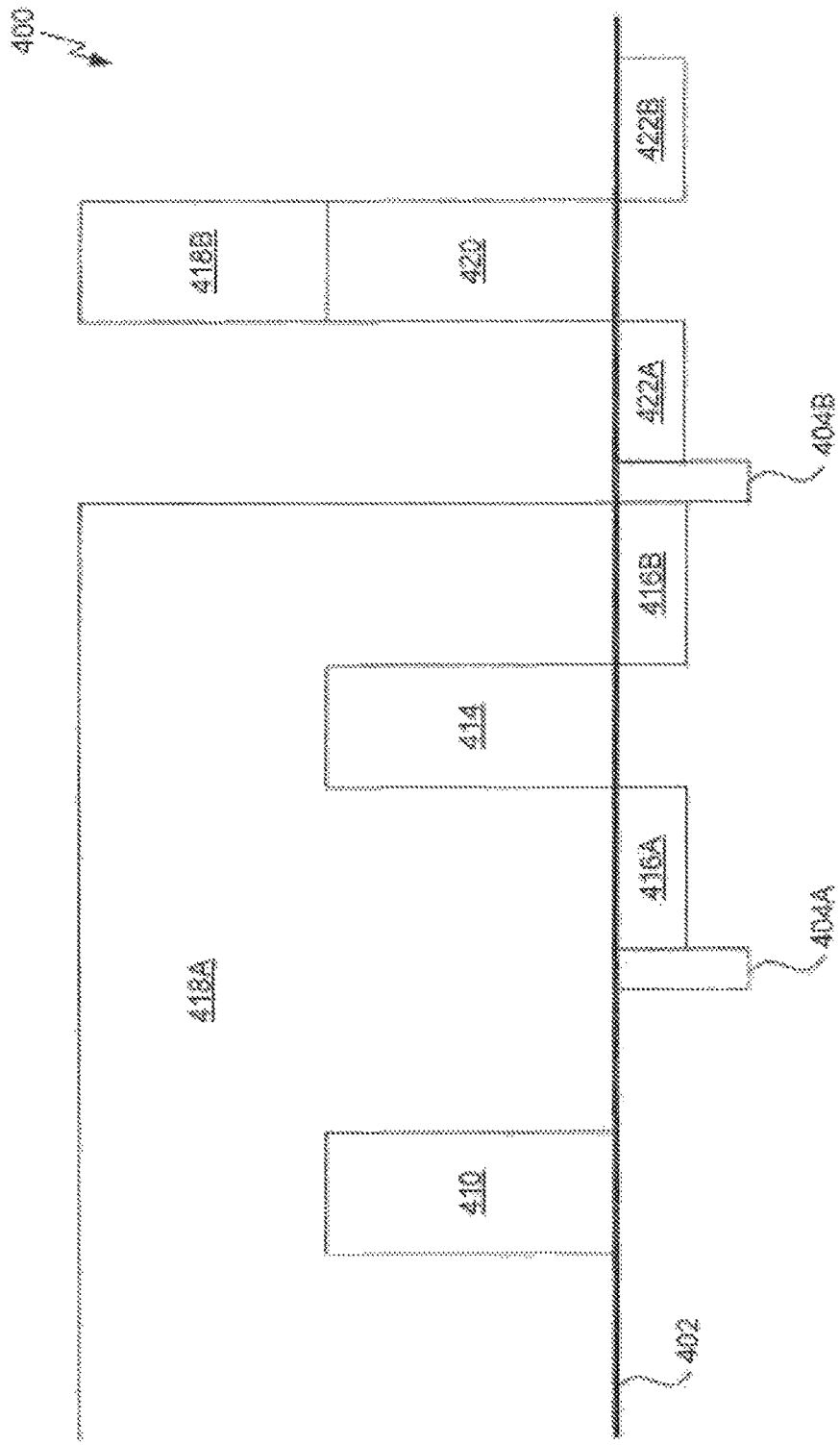

As illustrated by FIG. 4I, a second set of lightly doped source and drain regions 422 are implanted adjacent to the second high voltage transistor 420. The second set of lightly doped regions 422 are preferably formed from an edge of the second high voltage transistor 420, or even from slightly underneath the second high voltage transistor 420, and extend to the shallow trench isolation 404. It is preferred that the second set of lightly doped regions 422 are of complementary conductivity type to the first source and drain regions 416. For example, if the first source and drain regions 416 are p-type lightly doped regions (i.e., using a p⁻ conductivity type dopant), then the second set of lightly doped regions 422 are n-type lightly doped regions (i.e., using an n⁻ conductivity type dopant).

Figure 4J:
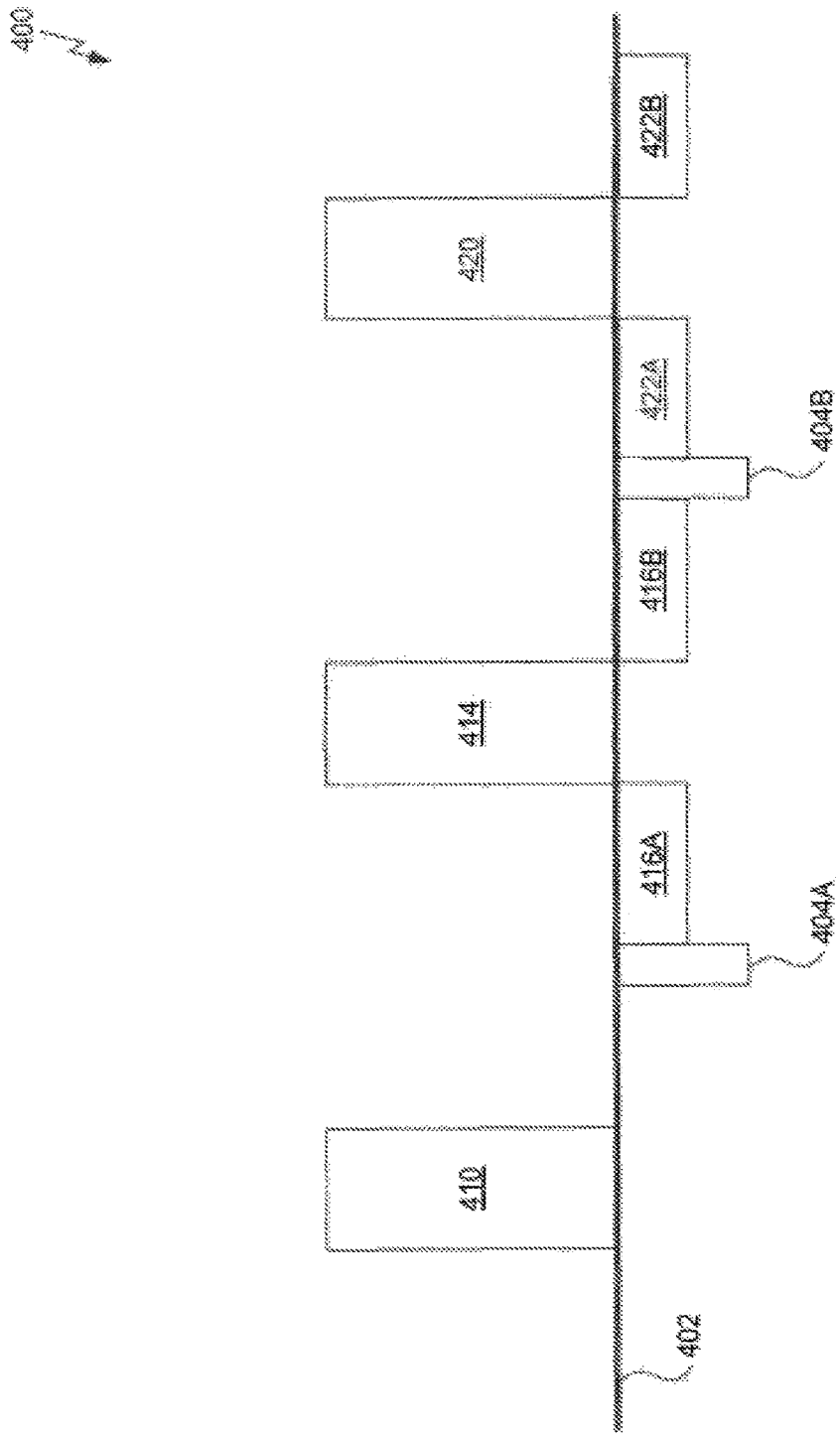

As illustrated by FIG. 4J, the photoresist mask 418 is stripped. Similar to the second photoresist mask 412, the third photoresist mask 418 has been used for both etching a high voltage transistor 420 and for implanting lightly doped source and drain regions 422.

The region of the substrate 402 to the left of the leftmost shallow trench isolation 404A is an example of a first substrate region. The low voltage transistor 410 in this substrate region is an example of a first gate. The poly layer 408 is an example of a thin poly layer. The region of the substrate 402 to the right of the left most shallow trench isolation 404A is an example of a second substrate region. The first high voltage transistor 414 is an example of a second gate. The lightly doped source and drain regions 416 adjacent to the first high voltage transistor 414 are examples of first source and drain regions substantially adjacent to the second gate. The second high voltage transistor 420 is an example of a third gate in the second substrate region. The lightly doped source and drain regions 422 adjacent to the second high voltage transistor 420 are an example of second source and drain regions being substantially adjacent to the third gate.

Following the step of FIG. 4J, traditional manufacturing steps may be performed. These steps can include, spacers, low energy source and drain implantations for the high voltage transistors 414 and 420 and low voltage transistor 410. Additional steps include silicide, inter-metal dielectric layers, contacts, metals and the like.

Though FIG. 4J shows a specific number of transistors 410, 414 and 420 being formed, other, presumably larger, numbers of these transistors may be formed according to this process. Further, memory cells may also be formed according to one of the processes described in co-pending application Ser. No. 13/715,739.

In an alternate method to the one illustrated in FIGS. 4A-4J, the high voltage transistors 414 and 420 may be formed before the low voltage transistor 410 is formed. In effect, the steps of FIGS. 4A and 4B would be moved to the end of the method.

The techniques described with reference to FIGS. 4A-4J may be applicable to analog semiconductor designs as well. In particular, the use of photoresists to protect thin poly from high energy implants may be relevant to analog circuitry, such as an operational amplifier, where-high energy implants can be used to form transistors that will conduct amplified amounts of power, but thin poly may be desired to improve the response time of the differential amplifier.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of forming an integrated circuit (IC) device, comprising:
   forming one or more first gates in a gate layer disposed over a substrate;
   forming, using a first photoresist mask, a second gate in the gate layer;
   implanting dopants into the substrate to form a first doped region, wherein the first photoresist mask is disposed over the one or more first gates and the second gate;
   forming, using a second photoresist mask, a third gate in the gate layer; and
   implanting dopants into the substrate to form a second doped region, wherein the second photoresist mask is disposed over the one or more first gates, the second gate, the first doped region, and the third gate,
   wherein the one or more first gates are configured to be a low voltage gate and at least one of the second gate and the third gate is configured to be a high voltage gate.

2. The method of claim 1, wherein implanting the dopants comprises using a high energy implant.

3. The method of claim 1, wherein the first doped region has a first conductivity type and the second doped region has a second conductivity type.

4. The method of claim 1, wherein the gate layer comprises metal.

5. The method of claim 1, wherein the gate layer comprises polysilicon.

6. The method of claim 1, wherein one or more first gates are configured to be a select gate of a memory cell.

7. The method of claim 1, wherein the gate layer of the at least one first gate, the second gate, and the third gate has a first thickness.

8. The method of claim 7, wherein the first thickness is between 40 nm and 100 nm.

9. The method of claim 8, wherein the first thickness is approximately 80 nm.

10. A method of manufacturing a semiconductor device, comprising:
- disposing a polysilicon layer over a first substrate region and over a second substrate region;
- forming one or more first gates in the polysilicon layer in the first substrate region, wherein the one or more first gate is configured to be a select gate of a memory cell;
- disposing a first photoresist mask over the polysilicon layer, the one or more first gates, the first substrate region, and the second substrate region;
- patterning the polysilicon layer to form a second gate in the second substrate region;
- performing a first high energy implant to form a first doped region in the second substrate region, wherein the first photoresist mask is disposed over the one or more first gates and the second gate; and
- removing the first photoresist mask.

11. The method of claim 10, further comprising:
- disposing a second photoresist mask over the polysilicon layer, the one or more first gates, the second gate, the first doped region, the first substrate region, and the second substrate region;
- patterning the polysilicon layer to form a third gate in the second substrate region;
- performing a second high energy implant to form a second doped region in the substrate, wherein the second photoresist mask is disposed over the one or more first gates, the second gate, the first doped region, and the third gate; and
- removing the second photoresist mask.

12. The method of claim 11, wherein the first doped region comprises a first lightly doped source and drain region having a first conductivity adjacent to the second gate.

13. The method of claim 12, wherein the second doped region comprises a second lightly doped source and drain region having a second conductivity adjacent to the third gate.

14. The method of claim 11, wherein performing the first and second high energy implants comprises using an ion energy of at least 80 KeV.

15. The method of claim 11, wherein the one or more first gates, the second gate, and the third gate have a first thickness.

16. The method of claim 15, wherein the first thickness is between 40 nm and 100 nm.

17. The method of claim 16, wherein the first thickness is approximately 80 nm.

18. The method of claim 10, wherein the first substrate region is configured to be a low voltage substrate region and the second substrate region is configured to be a high voltage substrate region.

* * * * *